United States Patent
Agarwal et al.

(10) Patent No.: US 8,331,646 B2
(45) Date of Patent: Dec. 11, 2012

(54) OPTICAL PROXIMITY CORRECTION FOR TRANSISTORS USING HARMONIC MEAN OF GATE LENGTH

(75) Inventors: Kanak B. Agarwal, Austin, TX (US); Shayak Banerjee, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 414 days.

(21) Appl. No.: 12/645,627

(22) Filed: Dec. 23, 2009

(65) Prior Publication Data
US 2011/0150343 A1 Jun. 23, 2011

(51) Int. Cl.
*G06K 9/00* (2006.01)

(52) U.S. Cl. .......................................... 382/144; 382/145

(58) Field of Classification Search .......... 382/141–152, 382/181, 190, 198–206, 195–196, 256, 266–269, 382/212–214; 716/50–56
See application file for complete search history.

(56) References Cited

U.S. PATENT DOCUMENTS

| | | | |
|---|---|---|---|
| 6,578,190 B2 | 6/2003 | Ferguson et al. |
| 6,961,916 B2 | 11/2005 | Sarrafzadeh et al. |
| 6,961,920 B2 | 11/2005 | Zach |
| 6,978,438 B1 | 12/2005 | Capodieci |
| 7,079,223 B2 | 7/2006 | Rosenbluth et al. |
| 7,237,221 B2 | 6/2007 | Granik et al. |
| 7,246,342 B2 | 7/2007 | Hsu et al. |
| 7,266,798 B2 | 9/2007 | Mansfield et al. |
| 7,318,214 B1 | 1/2008 | Prasad et al. |
| 7,325,224 B2 | 1/2008 | Seltmann et al. |
| 7,332,251 B2 | 2/2008 | Choi |
| 7,355,673 B2 | 4/2008 | Hsu et al. |
| 7,396,621 B2 | 7/2008 | Fujisawa |
| 7,398,508 B2 | 7/2008 | Shi et al. |
| 7,434,199 B2 | 10/2008 | Cobb et al. |
| 7,451,068 B2 | 11/2008 | Melvin, III |
| 7,487,490 B2 | 2/2009 | Zhang et al. |
| 7,539,954 B2 | 5/2009 | Adam |
| 7,694,267 B1 | 4/2010 | Ye et al. |
| 7,784,019 B1 | 8/2010 | Zach |
| 7,865,864 B2 | 1/2011 | Banerjee et al. |

(Continued)

OTHER PUBLICATIONS

Banerjee, S et al., "Compensating non-optical effects using electrically driven optical proximity correction", Proceedings of the SPIE—The International Society for Optical Engineering, vol. 7275, 2009, Design for Manufacturability through Design-Process Integration III Conference, Feb. 26-27, 2009, Abstract, 1 page.

(Continued)

*Primary Examiner* — Tri T Ton
(74) *Attorney, Agent, or Firm* — Francis Lammes; Stephen J. Walder, Jr.; Eustus D. Nelson

(57) ABSTRACT

A mechanism is provided for harmonic mean optical proximity correction (HMOPC). A lithographic simulator in a HMOPC mechanism generates an image of a mask shape based on a target shape on a wafer thereby forming one or more lithographic contours. A cost function evaluator module determines a geometric cost function associated with the one or more lithographic contours. An edge movement module minimizes the geometric cost function thereby forming a minimized geometric cost function. The edge movement module determines a set of edge movements for each slice in a set of slices associated with the one or more lithographic contours using the minimized geometric cost function. The edge movement module moves the edges of the mask shape using the set of edge movements for each slice in the set of slices. The HMOPC mechanism then produces a clean mask shape using the set of edge movements.

20 Claims, 7 Drawing Sheets

U.S. PATENT DOCUMENTS

| | | | |
|---|---|---|---|
| 7,908,572 | B2 | 3/2011 | Zhang |
| 8,146,026 | B2 | 3/2012 | Agarwal et al. |
| 8,230,372 | B2 | 7/2012 | Agarwal |
| 2005/0026310 | A1 | 2/2005 | Zhao et al. |
| 2005/0196682 | A1 | 9/2005 | Hsu et al. |
| 2005/0223350 | A1 | 10/2005 | Zhang et al. |
| 2006/0024850 | A1 | 2/2006 | Monahan et al. |
| 2006/0026541 | A1 | 2/2006 | Melvin, III et al. |
| 2006/0277521 | A1 | 12/2006 | Chen et al. |
| 2007/0209030 | A1 | 9/2007 | Tabery et al. |
| 2007/0248899 | A1 | 10/2007 | Choi |
| 2007/0266362 | A1 | 11/2007 | Lai et al. |
| 2008/0022255 | A1 | 1/2008 | Zach |
| 2008/0046846 | A1 | 2/2008 | Chew et al. |
| 2008/0193859 | A1 | 8/2008 | Hamouda |
| 2008/0248412 | A1 | 10/2008 | Stuber et al. |
| 2008/0263483 | A1 | 10/2008 | Koike et al. |
| 2009/0030636 | A1 | 1/2009 | Pan et al. |
| 2009/0144691 | A1 | 6/2009 | Rathsack et al. |
| 2009/0148783 | A1 | 6/2009 | Socha |
| 2009/0199151 | A1 | 8/2009 | Banerjee et al. |
| 2010/0115486 | A1 | 5/2010 | Barnes et al. |
| 2010/0122231 | A1 | 5/2010 | Agarwal et al. |
| 2010/0180251 | A1 | 7/2010 | Ye et al. |
| 2010/0269079 | A1 | 10/2010 | Banerjee et al. |
| 2010/0333049 | A1 | 12/2010 | Agarwal et al. |
| 2011/0119642 | A1 | 5/2011 | Agarwal et al. |
| 2011/0124193 | A1 | 5/2011 | Cheng et al. |
| 2011/0138342 | A1 | 6/2011 | Agarwal |
| 2011/0145770 | A1 | 6/2011 | Brooks et al. |
| 2011/0179391 | A1 | 7/2011 | Culp et al. |
| 2011/0202892 | A1 | 8/2011 | Lee et al. |
| 2011/0271238 | A1 | 11/2011 | Mansfield et al. |

OTHER PUBLICATIONS

Koike, K et al., "OPC to reduce variability of transistor properties", Proceedings of the SPIE—The International Society for Optical Engineering, vol. 6521, Design for Manufacturability through Design-Process Integration Conference, 28, Feb. 2007, Abstract, 1 page.

Teh, Siew-Hong et al., "Device Performance-based OPC for Optimal Circuit Performance and Mask Cost Reduction", Proceedings of SPIE, vol. 6925, 692511, 2008, 8 pages.

Interview Summary mailed Nov. 30, 2011 for U.S. Appl. No. 12/492,301; 4 pages.

Notice of Allowance mailed Dec. 1, 2011 for U.S. Appl. No. 12/619,742; 16 pages.

Response to Office Action filed with the USPTO on Jan. 6, 2012 for U.S. Appl. No. 12/630,216; 14 pages.

Response to Office Action filed with the USPTO on Nov. 9, 2011 for U.S. Appl. No. 12/492,301, 20 pages.

USPTO U.S. Appl. No. 12/856,208.

Bruce, James A. et al., "Model-Based Verification for First Time Right Manufacturing", Proceedings of SPIE, vol. 5756, 2005, pp. 198-207.

Cobb, Nick et al., "Fast Sparse Aerial Image Calculation for OPC", Proceedings of SPIE, vol. 2621, 1995, pp. 534-545.

Cobb, Nick, "Flexible sparse and dense OPC algorithms", Proceedings of SPIE, vol. 5853, 2005, pp. 693-702.

Cobb, Nick et al., "Mathematical and CAD Framework for Proximity Correction", Proceedings of SPIE, vol. 2726, Jun. 1996, pp. 208-222.

Cobb, Nick et al., "Model-based OPC using the MEEF matrix", Proceedings of SPIE, vol. 4889, 2002, pp. 1281-1292.

Cobb, Nick et al., "Using OPC to optimize for image slope and improve process window", Proceedings of SPIE, vol. 5130, 2003, pp. 838-846.

Kobayashi, Sachiko et al., "Automated hot-spot fixing system applied for metal layers of 65-nm logic devices", J. Micro/Nanolith, MEMS MOEMS, vol. 6(3), Jul.-Sep. 2007, 6 pages.

Krasnoperova, Azalia et al., "Process Window OPC for Reduced Process Variability and Enhanced Yield", Proceedings of SPIE, vol. 6154, 2006, 12 pages.

Liebmann, Lars W. et al., "Optimizing Style Options for Sub-Resolution Assist Features", Proceedings of SPIE, vol. 4346, 2001, pp. 141-152.

Liebmann, Lars et al., "Reducing DfM to Practice: the Lithography Manufacturability Assessor", Proceedings of SPIE, vol. 6156, 2006, 12 pages.

Liu, Yong et al., "Optimal bianry image design for optical lithography", Proceedings of SPIE, vol. 1264, 1990, pp. 401-412.

Mansfield, Scott et al., "Through-process modeling for design-for-manufacturability applications", J. Micro/Nanolith. MEMS MOEMS, vol. 6(3), Jul.-Sep. 2007, 9 pages.

Torres, J.A. et al., "Integrated Circuit DFM Framework for Deep Sub-Wavelength Processes", Proceedings of SPIE, vol. 5756, pp. 39-50.

Yang, Ellyn et al., "Model-Based Retarget for 45nm Node and Beyond"; Proceedings of SPIE, vol. 7274, 2009, 8 pages.

U.S. Appl. No. 12/024,188.

U.S. Appl. No. 12/492,301.

U.S. Appl. No. 12/619,742.

U.S. Appl. No. 12/630,216.

U.S. Appl. No. 12/770,791.

Bahnas, Mohamed et al., "OPC Model Calibration Considerations for Data Variance", SPIE Advanced Lithography Conference Paper, 2008, 10 pages.

Cao, Ke et al., "Standard Cell Characterization Considering Lithography Induced Variations", Design Automation Conference, 2006 43rd ACM/IEEE, pp. 801-804.

Heloue, Khaled R. et al., "Early Analysis and Budgeting of Margins and Corners Using Two-Sided Analytical Yield Models", Computer-Aided Design of Integrated Circuits and Systems, IEEE Transactions on volume 27, Issue 10, Oct. 2008, pp. 1826-1839.

Hsiao, Chia-Chi et al., "On Distinguishing Process Corners for Yield Enhancement in Memory Compiler Generated SRAM", Memory Technology, Design, and Testing, 2009. MTDT 2009. IEEE International Workshop on; Aug. 31, 2009-Sep. 2, 2009, pp. 83-87.

Hsu, Stephen D. et al., "Dipole Decomposition Mask-design for Full Chip Implementation at the 100nm Technology Node and Beyond", SPIE, vol. 4691, 2002, pp. 475-490.

Kawashima, Shinichi et al., "Implementation Requirements for Edge Exclusion Area Reduction for Maximized Output of Chips from a 200mm Wafer", Semiconductor Manufacturing, 2000. Proceedings of ISSM 2000. The Ninth International Symposium on; Sep. 26-28, 2000, pp. 98-101.

Wong, K et al., "Development of new methodology and technique to accelerate region yield improvement", Advanced Semiconductor Manufacturing Conference and Workshop, 1998. 1998 IEEE/SEMI; Sep. 23-25, 1998, pp. 82-85.

Yu, Peng et al., "Process Variation Aware OPC with Variation Lithography Modeling", Design Automation Conference, 2006 43rd ACM/IEEE, pp. 785-790.

Notice of Allowance mailed Jul. 18, 2012 for U.S. Appl. No. 12/492,301; 10 pages.

Office Action mailed Aug. 2, 2012 for U.S. Appl. No. 12/856,208; 9 pages.

Pre-Appeal Brief Conference Arguments filed Jun. 15, 2012, U.S. Appl. No. 12/492,301, 5 pages.

Response to Restriction Requirement filed with the USPTO Jul. 17, 2012 for U.S. Appl. No. 12/856,208; 8 pages.

Restriction Requirement mailed Jun. 18, 2012 for U.S. Appl. No. 12/856,208; 6 pages.

USPTO U.S. Appl. No. 13/526,984, 2 pages.

Final Office Action mailed Mar. 28, 2012 for U.S. Appl. No. 12/492,301; 13 pages.

Notice of Allowance mailed Mar. 19, 2012 for U.S. Appl. No. 12/630,216; 12 pages.

Office Action mailed Oct. 3, 2012 for U.S. Appl. No. 13/526,984; 15 pages.

OPTICAL PROXIMITY CORRECTION FOR TRANSISTORS USING HARMONIC MEAN OF GATE LENGTH

BACKGROUND

The present application relates generally to an improved data processing apparatus and method and more specifically to an apparatus and method for optical proximity correction for transistors using harmonic mean of gate length.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

The resolution of the photo-lithography system (R) can be described by the well-known Rayleigh's equation:

$$R = \frac{k_1 \lambda}{NA}$$

in which $\lambda$ is the wavelength of the light source, NA is the numerical aperture, and $k_1$ is the factor describing the complexity of resolution enhancement techniques. As the very-large-scale integration (VLSI) technology pushes further into nanometer region, the feasible wavelength of the photo-lithographic system remains unchanged at 193 nm. Although there is anticipation that extreme ultraviolet lithography (EUVL) with the wavelength of 13 nm will replace traditional optical lithography, the availability of EUVL remains uncertain due to technical challenges and cost issues. On the other hand, the physical limit of dry lithography of NA is 1.0. The recently introduced immersion lithography has bigger NA (1.2), but it is harder to further increase NA to even higher values. Thus it is commonly recognized that $k_1$ remains a cost effective knob to achieve finer resolution.

Due to the unavoidable diffraction, the optical lithography system is lossy in the sense that only low frequency components of the electromagnetic field can pass the optical system. Given a target layout of shapes that are desired to be manufactured, masks are generated that account for the non-linearities introduced by the lithographic process that prints wafer features that resemble the target. As the gap between the required feature size and lithography wavelength gets bigger, the final wafer images are quite different from the patterns on the mask. In the past few years, resolution enhancement techniques (RETs) have become necessary in order to achieve the required pattern density. One well-known RET is the optical proximity correction (OPC), in which the mask patterns are intentionally "distorted" so that the desired image can be formed on the wafer. Other commonly used RETs are sub-wavelength resolution assist features (SRAF) and phase-shift masks (PSM). Nowadays, considerable amount of computing power has to be dedicated to these post-layout processes (often referred as data prep).

The traditional method of performing OPC is called model-based OPC. Model-based OPC involves using models of optical and resist systems to simulate the wafer image of the mask. The simulation is followed by extracting the geometric error between the wafer feature and the target. The geometric error is called edge placement error (EPE). A cost function is defined as the summation of the EPEs across a layout and modifications of the mask are performed so as to minimize this cost function. A final mask solution is arrived at after several iterations of mask modifications and image simulations. The primary drawback of this type of mask modification is that it optimizes purely for geometric error between wafer and target features, which can often lead to non-optimal electrical performance. This problem is exacerbated by technology scaling, where the use of diffraction-limited optics coupled with variations in process conditions leads to higher electrical errors. Such errors are manifested in delay errors of individual logic cells and, at a more global level, errors in timing, which leads to a reduction in parametric yield.

SUMMARY

In one illustrative embodiment, a method, in a data processing system, is provided for harmonic mean optical proximity correction (HMOPC). The illustrative embodiment generates an image of a mask shape based on a target shape on a wafer thereby forming one or more lithographic contours. The illustrative embodiment determines a geometric cost function associated with the one or more lithographic contours. The illustrative embodiment minimizes the geometric cost function thereby forming a minimized geometric cost function. The illustrative embodiment determines a set of edge movements for each slice in a set of slices associated with the one or more lithographic contours using the minimized geometric cost function. The illustrative embodiment moves the edges of the mask shape using the set of edge movements for each slice in the set of slices. The illustrative embodiment then produces a clean mask shape using the set of edge movements.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism that uses a geometric cost function that has electrical significance to drive optical proximity correction (OPC) for transistors. The harmonic mean OPC (HMOPC) uses an inverse dependence of transistor current on gate length ($L_{gate}$) to derive a new geometric cost function to drive OPC. The gate of a transistor is the structure used to control output current (i.e. flow of carriers in the channel) in the transistor. The gate length is the effective length of the distance in a near-surface region of a substrate between edges of the drain and source regions in the transistor. Thus, the HMOPC uses a cost function that matches harmonic mean of length across device width to the target gate length. Matching harmonic mean of length provides better electrical matching than minimizing average error (matching arithmetic mean) of edge placement error (EPE). The HMOPC moves the mask edges so as to minimize the geometric cost function, which makes the OPC optimizations in the shape domain (i.e. using a geometric cost function) but being electrically aware.

Figure 1:
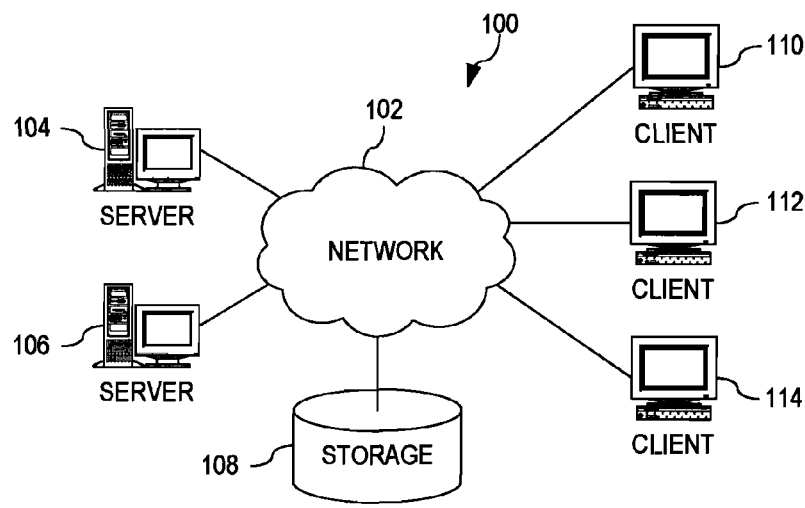
FIG. 1 depicts a pictorial representation of an example distributed data processing system in which aspects of the illustrative embodiments may be implemented.
Figure 2:
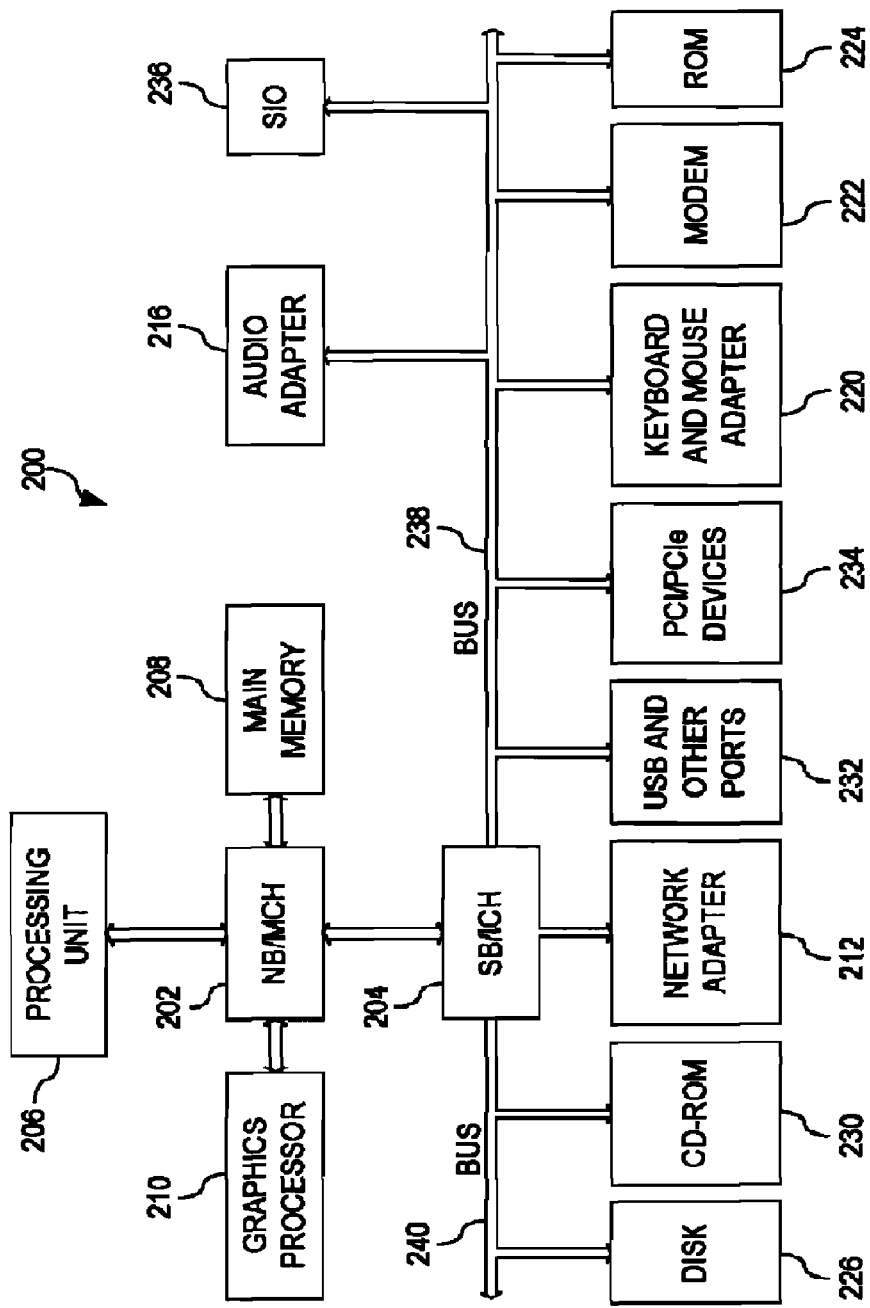
FIG. 2 shows a block diagram of an example data processing system in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented. While the description following FIGS. 1 and 2 will focus primarily on a single data processing device implementation of optical proximity correction for transistors using harmonic mean of gate length, this is only an example and is not intended to state or imply any limitation with regard to the features of the present invention.

With reference now to the figures and in particular with reference to FIGS. 1-2, example diagrams of data processing environments are provided in which illustrative embodiments of the present invention may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

Figure 3:
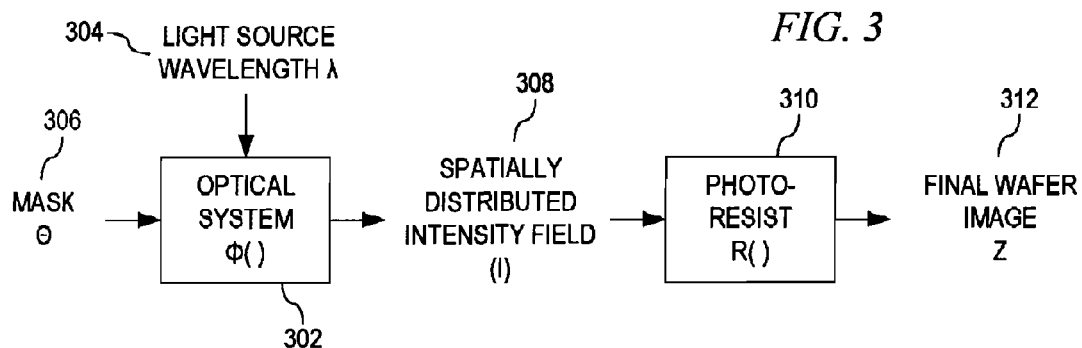
FIG. 3 illustrates a highly simplified schematic view of a state-of-the-art optical lithography process.

FIG. 3 illustrates a highly simplified schematic view of a state-of-the-art optical lithography process. In optical system ($\Phi(\ )$) 302, light source 304 of wavelength λ projects through received mask ($\Theta$) 306 to achieve a spatially distributed intensity field (I) 308 on the wafer source. After chemical reactions of photo-resist ($R(\ )$) 310 on the wafer source, final wafer image (Z) 312 forms on the wafer source.

As discussed above, optical proximity correction (OPC) is typically used in the design of integrated circuits to correct for discrepancies that exist between patterns on an initial mask layout and how these patterns print on a semiconductor wafer using optical lithography. A typical OPC operation involves fragmentation and subsequent distortion of mask features to ensure that structures printed on the wafer closely resemble target shapes embodied in the initial mask layout. In particular, upon receiving the initial mask layout, a typical OPC operation begins by generating assist features and sizing features up for etch bias. This is followed by fragmentation to generate edges which can be subsequently moved to generate the target shapes. A lithography simulation supported by optical and resist models is run to help determine the resist shapes. Edge placement errors between printed shapes and target shape features embodied in the initial mask layout are determined at a number of sites and used to determine the amount of edge movements of the shapes in the mask layout that are needed to reduce these errors. Essentially, edge placement error (EPE) is a metric of how much difference there is between the patterns in the target layout and the output of the simulation or, put another way, EPE ($e_i$) is a geometric difference between contour and target and is used to derive the following cost function to drive OPC.

$$C_{OPC} = \sum_i e_i$$

If there is a large amount of disturbance, then the OPC moves edges and shapes in initial mask layout appropriately to control the amount of EPE. Once the OPC has determined that the EPEs are in control, then an output mask layout is generated and transferred to a mask house for mask preparation.

However, there are several shortcomings associated with using this OPC methodology. One shortcoming is that this OPC methodology concentrates on maintaining the edges of the shapes by minimizing EPEs to obtain pattern fidelity between the target layout and lithography simulation output (i.e., the layout that will be printed on the wafer), but this does not necessarily guarantee that electric characteristics of the shapes will be obtained. For example, current through a transistor is inversely proportional to gate length, whereas minimization of EPE leads to a linear control over gate length, suggesting that a non-rectangular shape may actually exhibit more accurate electrical behavior. This inability to guarantee ideal electrical behavior characteristics affects parametric yield during manufacturing. Another shortcoming is that a large amount of computational effort is spent in correcting for corners and other regions which are electrically non-critical and may only be important from a catastrophic yield point of view (e.g., opens, shorts, etc.).

There are certain newly proposed OPC methodologies that use an electrical cost function based on current of the devices to drive OPC that results in reduced electrical error. Such OPC is called electrically-driven OPC (EDOPC). One example of an electrical cost function is:

$$C_{OPC} = \sum_i |I_{contour,i} - I_{target,i}|$$

However, electrically driven OPC (EDOPC) requires passing electrical information, such as target current, to the OPC. That is, EDOPC requires technology specific target electrical characteristics for each device in the design. Thus, there is a significant methodology shift as layout shapes have to be augmented with the electrical data before being passed to OPC. Additionally, EDOPC requires models to predict electrical behavior of litho contours (non-rectangular gates). Thus, the accuracy of the OPC tool depends on the accuracy of the models. Therefore, EDOPC is computationally involved as every iteration of OPC computes electrical behavior of the simulated contour.

The illustrative embodiments provide a harmonic mean optical proximity correction (HMOPC) mechanism that uses a geometric cost function that has electrical significance to drive OPC. The HMOPC mechanism comprises a new geometric cost function that uses the dependence of transistor current on gate length ($L_{gate}$) of the transistor. To the first order, the transistor current is inversely proportional to $L_{gate}$. Thus the HMOPC mechanism uses a cost function that matches harmonic mean of length across device width to the target gate length. Matching harmonic mean of length provides better electrical matching than minimizing average error (matching arithmetic mean). The HMOPC moves the mask edges so as to minimize the geometric cost function. The OPC optimizations are in the shape domain (geometric cost function) but are electrically aware.

Figure 4:
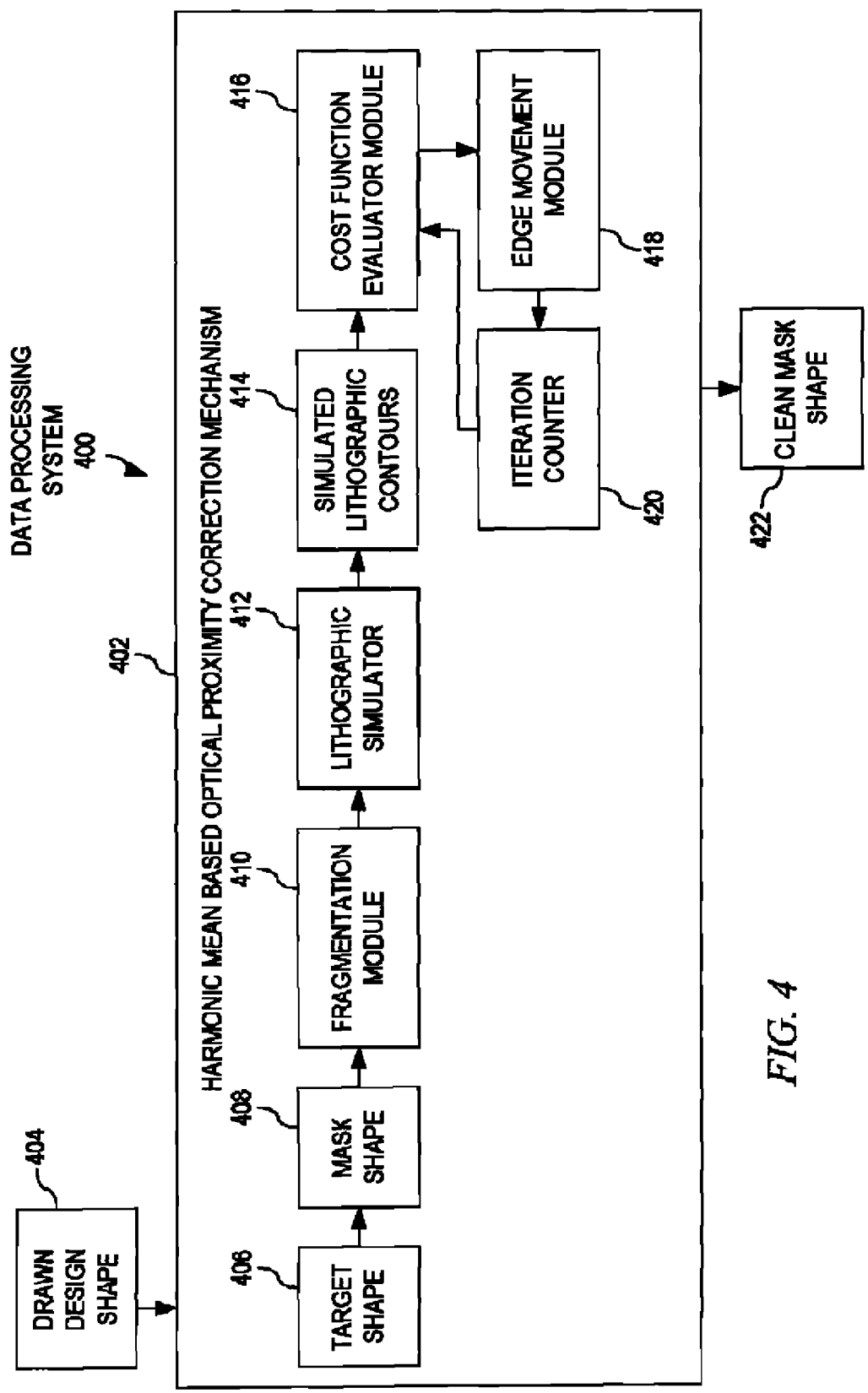
FIG. 4 depicts a block diagram of a harmonic mean based optical proximity correction (HMOPC) for photolithographic layouts in accordance with an illustrative embodiment.

FIG. 4 depicts a block diagram of a harmonic mean based optical proximity correction (HMOPC) for photolithographic layouts in accordance with an illustrative embodiment. HMOPC mechanism 402 in data processing system 400 initially receives drawn design shape 404 from a designer. HMOPC mechanism 402 uses drawn design shape 404 as initial target shape 406. HMOPC mechanism 402 then generates initial mask shape 408. During the first pass, HMOPC mechanism 402 generates initial mask shape 408 that may be substantially the same as initial target shape 406.

After HMOPC mechanism 402 generates initial mask shape 408, fragmentation module 410 performs accuracy-based fragmentation by taking edges of the layered shapes in the initial mask layout and fragmenting them into small strips so that comparison of features between the output of the simulation and the mask layout are made easier. The fragment size represents a tradeoff between mask complexity and accuracy. Smaller fragments allow better convergence in terms of current-matching accuracy but lead to highly complex masks, thus increasing mask cost. Small fragments also translate to higher computation time, so determining fragment size is based on accuracy of the current matching desired for the polysilicon layer.

Figure 5:
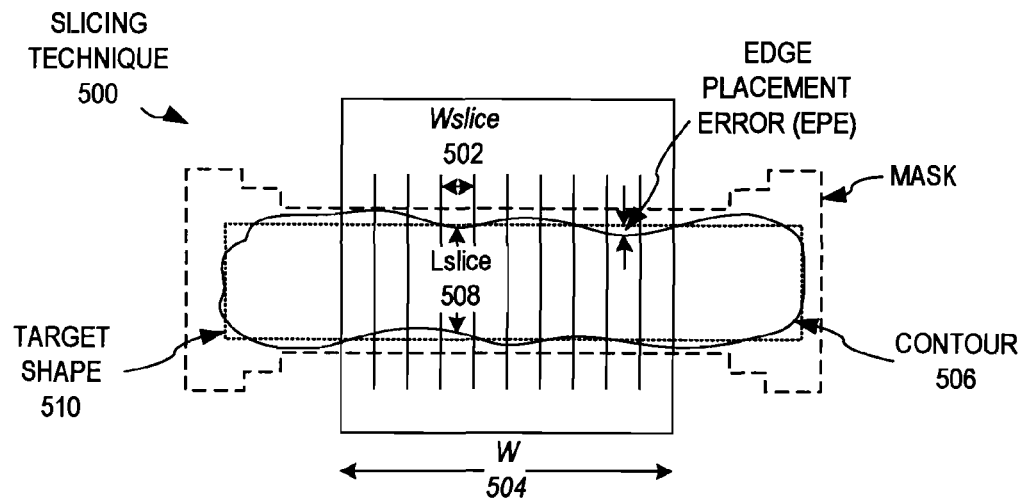
FIG. 5 shows a slicing technique in accordance with an illustrative embodiment.

After fragmentation module 410 performs the accuracy-based fragmentation, lithographic simulator 412 simulates how the shapes and their features in the polysilicon layer of the layout will look on an actual wafer and produces simulated lithographic contours 414. Using simulated lithographic contours 414, cost function evaluator module 416 determines a geometric cost function associated with simulated lithographic contours 414. Cost function evaluator module 416 develops a cost function based on geometries that have an electrical significance. In order to analyze the electrical behavior of a polysilicon contour, cost function evaluator module 416 relates the on-current flowing through the polysilicon contour to geometries of the polysilicon contour. For this purpose, cost function evaluator module 416 uses a slicing technique, such as slicing technique shown in FIG. 5 in accordance with an illustrative embodiment. Slicing technique 500 works on the fundamental principle that any transistor can be represented as a set of parallel transistors (called slices and shown as $w_{slice}$ 502) provided the sum of the widths W 504 of the set of $w_{slices}$ 502 equals the width of the transistor. Slices are assumed to be small enough to have constant gate length. As a result, this length is mapped to the slice current. Normal methods use a simulated program with integrated circuit emphasis (SPICE) generated curve for highly accurate mapping. Different curves are used for on and off currents. This is also the approach used in the electrically-driven OPC (EDOPC) technique. However, as mentioned before, such mapping is computationally expensive and requires technology characterized data, which depend on the accuracy of the electrical models as well. Cost function evaluator module 416 utilizes the geometric information available in transistor contour 506 to approximate the electrical properties of the transistor.

The total current through the transistor contour 506, $I_{contour}$, is the sum of the individual slice currents, $I_{slice,i}$, and may be calculated using the following formula.

$$I_{contour} = \sum_i I_{slice,i}$$

Each slice current, $I_{slice,i}$ is inversely proportional to the slice length 508, $L_{slice,i}$, which may be calculated using the following formula.

$$I_{slice,i} = k \frac{w_{slice,i}}{L_{slice,i}}$$

where $w_{slice,i}$ is the width of the individual slice 502 and k is a proportionality constant, which is an expression that captures the first-order dependence of current on slice length only, but is a faster approximation than using full mapping of slice lengths to slice currents as is used in electrically-driven OPC (ED-OPC). Using the individual slice current, the error between the total current through the printed transistor contour 506, $I_{contour}$, and the total current of the target 510, $I_{target}$, is written using the following formula.

$$I_{contour} - I_{target} = \sum_i k \frac{w_{slice,i}}{L_{slice,i}} - k \frac{W}{L_{nom}}$$

where W is the total transistor width 504 and $L_{nom}$ is the nominal length of the transistor.

The calculated difference in current between the printed transistor and target is then used to define a new cost function to drive OPC. Assuming uniform slicing (i.e., slices of equal width w), this new geometric cost function for transistors is described in the following formula.

$$C_{OPC} = I_{contour} - I_{target} = k \left[ \sum_i \frac{W}{L_{slice,i}} - \sum_i \frac{W}{L_{nom}} \right]$$

which may be rewritten as:

$$C_{OPC} = \sum_i \left[ \frac{1}{L_{slice,i}} - \frac{1}{L_{nom}} \right]$$

The objective function of this HMOPC optimization formulation aims at accuracy of timing by minimizing the difference in the on-currents between the target and the contour. However, compared to previous approaches on electrically-driven OPC (EDOPC), the HMOPC optimization formulation does not directly measure currents, but, rather, uses a geometric cost function with some electrical significance.

Figure 6:
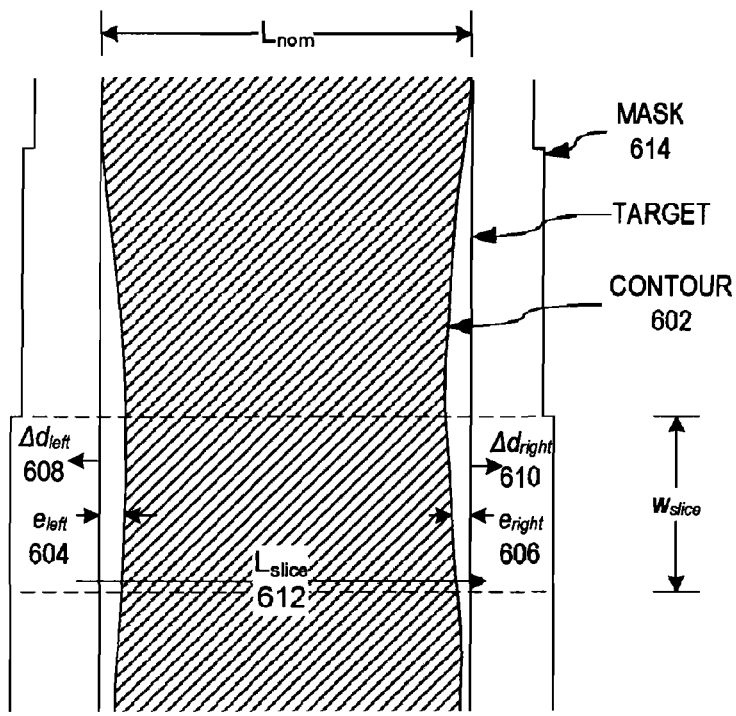
FIG. 6 depicts a slice of a transistor contour in accordance with an illustrative embodiment.

Once the geometric cost function has been determined, then edge movement module 418 uses a gradient decent-based mask movement strategy to minimize the geometric cost function to form a minimized geometric cost function. FIG. 6 depicts a slice of a transistor contour in accordance with an illustrative embodiment. Transistor contour 602 has edge placement errors (EPEs) to the left 604 ($e_{left}$) and the right 606 ($e_{right}$). Edge movement module 418 determines the fragment movement for left side of the slice 608 ($\Delta d_{left}$) and right side of the slice 610 ($\Delta d_{right}$) based on data provided from the designer. The slice length 612, $L_{slice}$, is related to the edge placement errors $e_{left}$ 604 and $e_{right}$ 606, which may be calculated for each slice using the following formula.

$$L_{slice,i} = L_{nom} + e_{left,i} + e_{right,i}$$

Edge movement module 418 then analytically obtains a derivative of the geometric cost function in terms of mask 614 movement for the left side of the slice and the right side of the slice. The derivative for the left side of the slice is described in the following formula.

$$\frac{\partial C_{OPC}}{\partial d_{left,i}} = -\frac{1}{L_{slice,i}^2} \frac{\partial e_{left,i}}{\partial d_{left,i}}$$

The derivative for the right side of the slice is described in the following formula.

$$\frac{\partial C_{OPC}}{\partial d_{right,i}} = -\frac{1}{L_{slice,i}^2} \frac{\partial e_{right,i}}{\partial d_{right,i}}$$

where the partial derivative ($\partial e/\partial d$) is usually approximated by $+/-\Delta$ and only the sign is necessary to determine the direction of movement and where $d_{right,i}$ is the location of the mask fragment for the right side of the slice and $d_{left,i}$ is the location of the mask fragment for the left side of the slice.

With the derivative of the geometric cost function (i.e. the minimized geometric cost function) in terms of mask 614 movement for the left side of the slice and the right side of the slice determined, edge movement module 418 determines the amount of mask 614 movement $\Delta d$ for both the left and the right sides of each slice using this gradient value. The gradient decent-based mask movement $\Delta d_{left,i}$ for the left side of the slice is described in the following formula as a pre-specified fraction ($\eta$) of the derivative.

$$\Delta d_{left,i} = -\eta \frac{\partial C_{OPC}}{\partial d_{left,i}}$$

Similarly, the gradient decent-based mask movement $\Delta d_{right,i}$ for the right side of the slice is described in the following formula.

$$\Delta d_{right,i} = -\eta \frac{\partial C_{OPC}}{\partial d_{right,i}}$$

HMOPC mechanism 402 provides for edge movement module 418 to analytically evaluate the magnitude and direction for edge movement up to a maximum predetermined number of iterations. Therefore, each time edge movement module 418 analytically evaluates the edge movement in mask shape 408, iteration counter 420 within HMOPC mechanism 402 increments. Once the value of iteration counter 420 exceeds the maximum predetermined number of iterations, HMOPC mechanism 402 produces clean mask shape 422.

Thus, the harmonic mean optical proximity correction (HMOPC) mechanism of the illustrative embodiments provides for using a geometric cost function that has electrical significance to drive OPC. HMOPC uses the dependence of transistor current on gate length ($L_{gate}$) to derive a new geometric cost function. HMOPC then uses the geometric cost function that matches harmonic mean of length across device width to the target gate length. Matching harmonic mean of length provides better electrical matching than minimizing average error (matching arithmetic mean). The HMOPC moves the mask edges using a gradient-descent based strategy so as to minimize the geometric cost function.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 7:
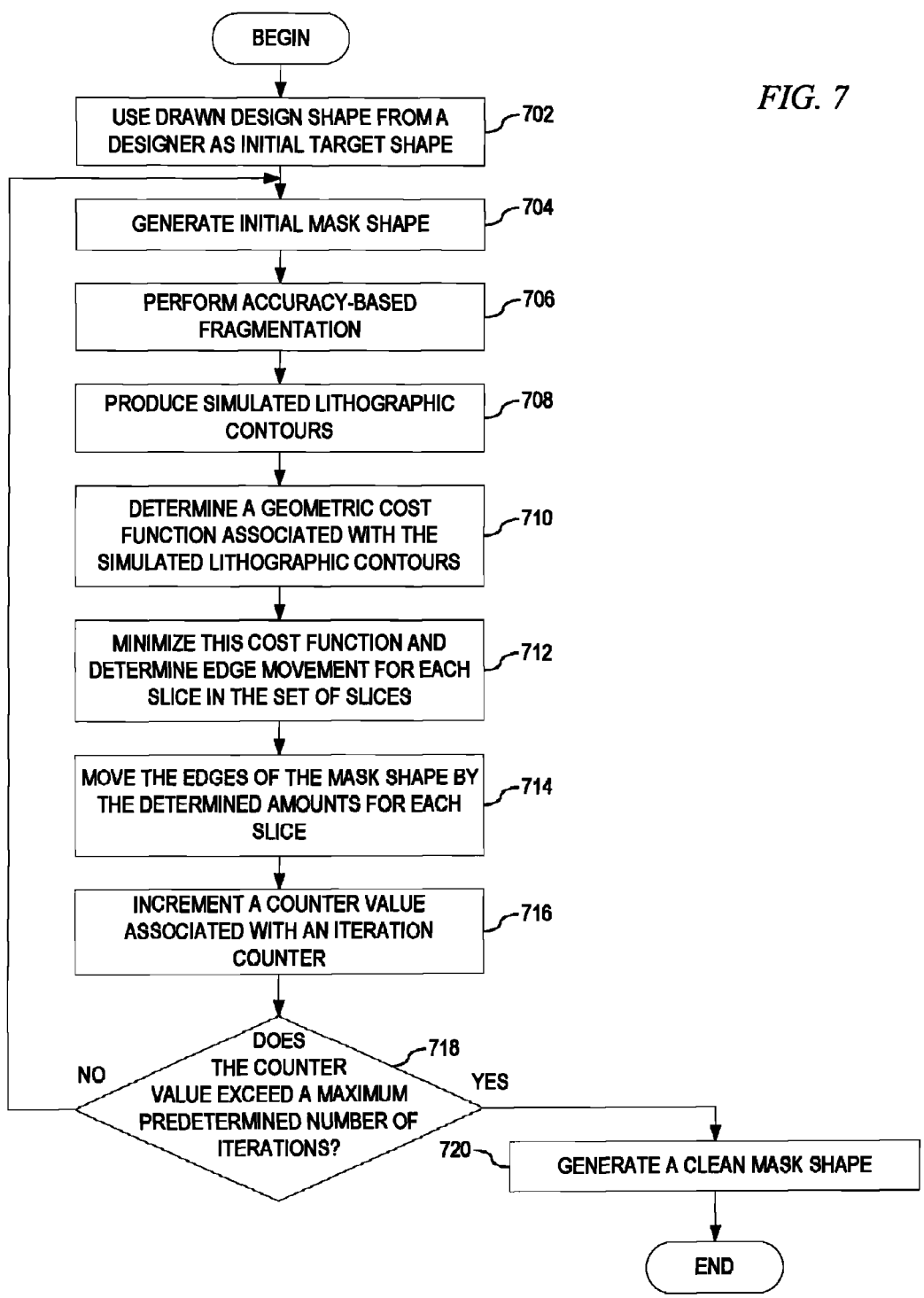
FIG. 7 depicts the overall operation performed by the harmonic mean optical proximity correction (HMOPC) mechanism in accordance with an illustrative embodiment.
Figure 8:
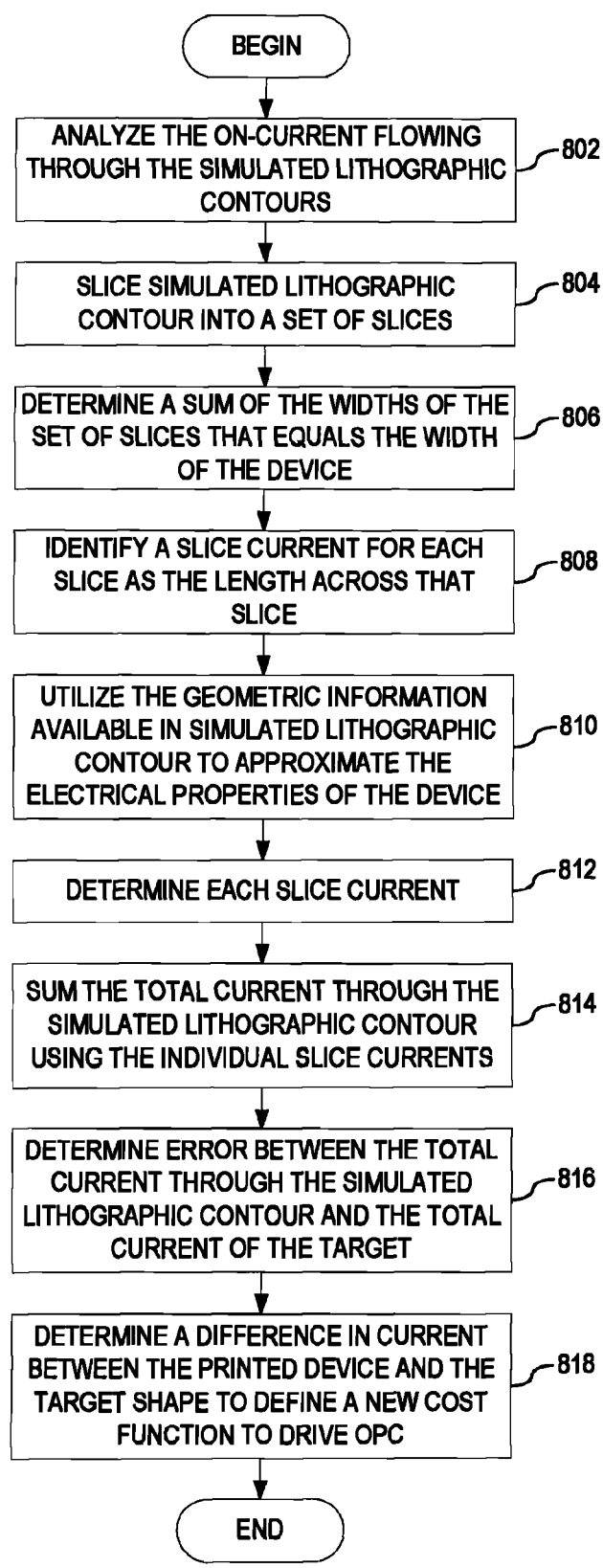
FIG. 8 depicts the operations performed by the cost function evaluator module in developing a cost function based on geometries that have an electrical significance in order to analyze the electrical behavior of a single simulated lithographic contour in accordance with an illustrative embodiment.
Figure 9:
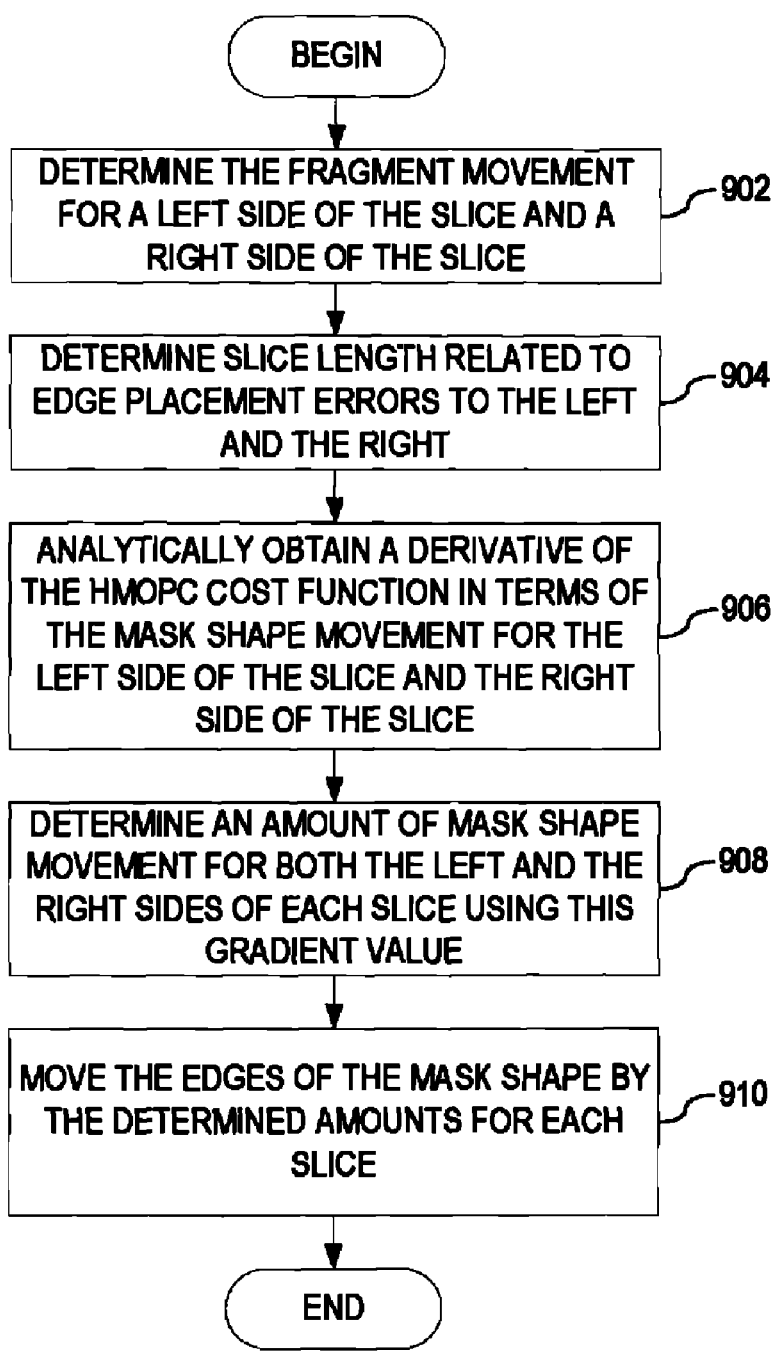
FIG. 9 depicts the operation performed by the edge movement module in order to minimize the geometric cost function and determine the set of edge movements for each slice in the set of slices in accordance with an illustrative embodiment.

Referring now to FIGS. 7-9, these figures provide a flowchart outlining example operations performed by harmonic mean optical proximity correction (HMOPC) mechanism in accordance with an illustrative embodiment. FIG. 7 depicts the overall operation performed by the harmonic mean optical proximity correction (HMOPC) mechanism in accordance with an illustrative embodiment. As the operation begins, the HMOPC mechanism initially receives a drawn design shape from a designer that is used as an initial target shape (step 702). Using the initial target shape, the HMOPC mechanism generates an initial mask shape (step 704). During the first pass, the HMOPC mechanism generates the initial mask shape that may be substantially the same as the initial target shape. After the HMOPC mechanism generates the initial mask shape, a fragmentation module performs accuracy-based fragmentation by taking edges of the layered shapes in the initial mask layout and fragmenting them into small strips so that comparison of features between the output of the simulation and the mask layout are made easier (step 706). The fragment size represents a tradeoff between mask complexity and accuracy. Smaller fragments allow better convergence in terms of current-matching accuracy but lead to highly complex masks, thus increasing mask cost. Small fragments also translate to higher computation time, so determining fragment size is based on accuracy of the current matching desired for the polysilicon layer.

After the fragmentation module performs the accuracy-based fragmentation, the lithographic simulator simulates how the shapes and their features in the polysilicon layer of the layout will look on an actual wafer and produces simulated lithographic contours (step 708). Using the simulated lithographic contours, a cost function evaluator module determines a geometric cost function associated with the simulated lithographic contours (step 710). That is, the cost function evaluator module develops a cost function based on geometries that have an electrical significance, which is further described in FIG. 8.

Once the geometric cost function has been determined, an edge movement module uses a gradient decent-based mask movement strategy to minimize the geometric cost function to thereby form a minimized geometric cost function and determine a set of edge movements for each slice in the set of slices (step 712). The operation performed by the edge movement module in order to minimize the geometric cost function and determine the set of edge movements is further described in FIG. 9. Once the edge movement is determined, the edge movement module moves the edges of the mask shape by the determined amounts for each slice (step 714). The HMOPC mechanism provides for the edge movement module to analytically evaluate the magnitude and direction for edge movement up to a maximum predetermined number of iterations. Therefore, each time edge movement module analytically evaluates the edge movement in the mask shape, the HMOPC mechanism increments a counter value associated with an iteration counter (step 716). The HMOPC mechanism then determines whether the counter value exceeds a maximum predetermined number of iterations (step 718). If at step 718 the counter value fails to exceed the maximum predetermined number of iterations, then the operation returns to step 704, where a new mask shape is produced. If at step 718 the counter value exceeds a maximum predetermined number of iterations, then the HMOPC mechanism produces a clean mask shape (step 720), with the operation terminating thereafter.

FIG. 8 depicts the operations performed by the cost function evaluator module in developing a cost function based on geometries that have an electrical significance in order to analyze the electrical behavior of a single simulated lithographic contour in accordance with an illustrative embodiment. As the operation begins, the cost function evaluator module analyzes the on-current flowing through the simulated lithographic contours (step 802). For this purpose, the cost function evaluator module slices simulated lithographic contour into a set of slices, such that the device represented by the simulated lithographic contour may be represented as a set of parallel devices called slices (step 804). The cost function evaluator module also determines a sum of the widths of the set of slices that equals the width of the device (step 806). Each of the set of slices are assumed to be small enough to have constant gate length. As a result, the cost function evaluator module identifies a slice current for each slice and writes the slice current in terms of the length across that slice using a first-order dependence (step 808). The cost function evaluator module then utilizes the geometric information available in simulated lithographic contour to approximate the electrical properties of the device (step 810).

The cost function evaluator module determines each slice current, $I_{slice,i}$ as being inversely proportional to the slice length, $L_{slice,i}$, using the following formula (step 812).

$$I_{slice,i} = k \frac{w_{slice,i}}{L_{slice,i}}$$

where $w_{slice,i}$ is the width of the individual slice and k is a proportionality constant, which is an expression that captures the first-order dependence of current on slice length only. The cost function evaluator module sums the total current through the simulated lithographic contour, $I_{contour}$, using the individual slice currents, $I_{slice,i}$, and the following formula (step 814).

$$I_{contour} = \sum_i I_{slice,i}$$

Using the individual slice current, the cost function evaluator module determines the error between the total current through the simulated lithographic contour, $I_{contour}$, and the total current of the target, $I_{target}$, using the following formula (step 816).

$$I_{contour} - I_{target} = \sum_i k \frac{w_{slice,i}}{L_{slice,i}} - k \frac{W}{L_{nom}}$$

where W is the total device width and $L_{nom}$, is the nominal length of the device.

The cost function evaluator module then determines a difference in current between the printed device and the target shape to define a new cost function to drive OPC (step 818). Assuming uniform slicing (i.e., slices of equal width w), this new geometric cost function for devices is described in the following formula.

$$C_{OPC} = I_{contour} - I_{target} = k \left[ \sum_i \frac{W}{L_{slice,i}} - \sum_i \frac{W}{L_{nom}} \right]$$

which may be rewritten as:

$$C_{OPC} = \sum_i \left[ \frac{1}{L_{slice,i}} - \frac{1}{L_{nom}} \right]$$

The objective function of this HMOPC optimization formulation aims at accuracy of timing by minimizing the difference in the on-currents between the target and the contour. However, compared to previous approaches on electrically-driven OPC (EDOPC), the HMOPC optimization formulation does not directly measure currents, but, rather, uses a geometric cost function with some electrical significance. After step 818, the operation performed by the cost function evaluator module ends.

FIG. 9 depicts the operation performed by the edge movement module in order to minimize the geometric cost function to thereby form a minimized geometric cost fucntion and determine the set of edge movements for each slice in the set of slices in accordance with an illustrative embodiment. As the operation begins, the edge movement module determines the fragment movement for a left side of the slice ($\Delta d_{left}$) and a right side of the slice ($\Delta d_{right}$) based on data provided from the designer (step 902). The edge movement module determines whether slice length, $L_{slice}$, is related to edge placement errors (EPEs) to the left ($e_{left}$) and the right ($e_{right}$) using the following formula (step 904).

$$L_{slice,i} = L_{nom} + e_{left,i} + e_{right,i}$$

The edge movement module then analytically obtains a derivative of the geometric cost function in terms of the mask shape movement for the left side of the slice and the right side of the slice (step 906). The derivative for the left side of the slice is described in the following formula.

$$\frac{\partial C_{OPC}}{\partial d_{left,i}} = -\frac{1}{L_{slice,i}^2} \frac{\partial e_{left,i}}{\partial d_{left,i}}$$

The derivative for the right side of the slice is described in the following formula.

$$\frac{\partial C_{OPC}}{\partial d_{right,i}} = -\frac{1}{L_{slice,i}^2} \frac{\partial e_{right,i}}{\partial d_{right,i}}$$

where the partial derivative ($\partial e/\partial d$) is usually approximated by $+/-\Delta$ and only the sign is necessary to determine the direction of movement.

With the a derivative of the geometric cost function (i.e. the minimized geometric cost function) in terms of the mask shape movement for the left side of the slice and the right side of the slice determined, the edge movement module determines an amount of mask shape movement $\Delta d$ for both the left and the right sides of each slice using this gradient value (step 908). The gradient decent-based mask movement $\Delta d_{left,i}$ for the left side of the slice is described in the following formula as a pre-specified fraction ($\eta$) of the derivative.

$$\Delta d_{left,i} = -\eta \frac{\partial C_{OPC}}{\partial d_{left,i}}$$

Similarly, the gradient decent-based mask movement $\Delta d_{right,i}$ for the right side of the slice is described in the following formula.

$$\Delta d_{right,i} = -\eta \frac{\partial C_{OPC}}{\partial d_{right,i}}$$

Once the $\Delta d_{left,i}$ and $\Delta d_{right,i}$ movements are determines, the edge movement module moves the edges of the mask shape by the determined amounts for each slice (step 910), which is the same step as step 714 of FIG. 7. After step 910, the operation performed by the edge movement module ends.

The flowcharts and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiment provides a mechanism that uses a geometric cost function that has electrical significance to drive optical proximity correction (OPC) for transistors. The harmonic mean OPC (HMOPC) uses an inverse dependence of transistor current on gate length (Lgate) to derive a new geometric cost function to drive OPC. The gate of a transistor is the structure used to control output current (i.e. flow of carriers in the channel) in the transistor. The gate length is the effective length of the distance in a near-surface region of a substrate between edges of the drain and source regions in the transistor. Thus, the HMOPC uses a cost function that matches harmonic mean of length across device width to the target gate length. Matching harmonic mean of length provides better electrical matching than minimizing average error (matching arithmetic mean) of edge placement error (EPE). The HMOPC moves the mask edges so as to minimize the geometric cost function, which makes the OPC optimizations in the shape domain (i.e. using a geometric cost function) but being electrically aware.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for harmonic mean optical proximity correction (HMOPC), the method comprising:
   generating, by a lithographic simulator in a HMOPC mechanism, an image of a mask shape based on a target shape on a wafer thereby forming one or more lithographic contours;
   determining, by a cost function evaluator module, a geometric cost function associated with the one or more lithographic contours;
   minimizing, by an edge movement module, the geometric cost function thereby forming a minimized geometric cost function;
   determining, by the edge movement module, a set of edge movements for each slice in a set of slices associated with the one or more lithographic contours using the minimized geometric cost function;
   moving, by the edge movement module, the edges of the mask shape using the set of edge movements for each slice in the set of slices; and
   producing, by the HMOPC mechanism, a clean mask shape using the set of edge movements.

2. The method of claim 1, wherein determining the geometric cost function associated with the one or more lithographic contours further comprises:
   slicing, by the cost function evaluator module, the one or more lithographic contours into the set of slices;
   determining, by the cost function evaluator module, a sum of widths of the set of slices thereby forming a width of the device;
   identifying, by the cost function evaluator module, a slice current for each slice thereby forming a set of individual slice currents;
   summing, by the cost function evaluator module, a total current through the one or more lithographic contours using the set of individual slice currents;

determining, by the cost function evaluator module, an error between the total current through the one or more lithographic contours and a total current of the target shape; and determining, by the cost function evaluator module, a difference in current between the one or more lithographic contours and the target shape to thereby form the geometric cost function.

3. The method of claim 2, wherein each slice current is determined using the following formula:

$$I_{slice,i} = k \frac{w_{slice,i}}{L_{slice,i}}$$

wherein $I_{slice,i}$ is the individual slice current, wherein $L_{slice,i}$ is a length of the slice, wherein $w_{slice,i}$ is a width of the individual slice, and wherein k is a proportionality constant that captures a first-order dependence of current on slice length only.

4. The method of claim 2, wherein the total current through the one or more lithographic contours using the individual slice currents is determined using the following formula:

$$I_{contour} = \sum_i I_{slice,i}$$

wherein $I_{contour}$ is the total current and wherein $I_{slice,i}$ is the individual slice current.

5. The method of claim 2, wherein the error between the total current through the one or more lithographic contours and the total current of the target shape is determined using the following formula:

$$I_{contour} - I_{target} = \sum_i k \frac{w_{slice,i}}{L_{slice,i}} - k \frac{W}{L_{nom}}$$

wherein $I_{contour}$ is the total current through the one or more lithographic contours, wherein $I_{target}$ is the total current of the target, wherein $L_{slice,i}$ is a length of the slice, wherein $w_{slice,i}$ is a width of the individual slice, wherein k is a proportionality constant that captures a first-order dependence of current on slice length only, wherein W is the total device width, and wherein $L_{nom}$ is the nominal length of the device.

6. The method of claim 2, wherein the geometric cost function is described for the device in the following formula:

$$C_{OPC} = I_{contour} - I_{target} = k \left[ \sum_i \frac{W}{L_{slice,i}} - \sum_i \frac{W}{L_{nom}} \right]$$

which may be rewritten as:

$$C_{OPC} = \sum_i \left[ \frac{1}{L_{slice,i}} - \frac{1}{L_{nom}} \right]$$

wherein $I_{contour}$ is the total current through the one or more lithographic contours, wherein $I_{target}$ is the total current of the target, wherein $L_{slice,i}$ is a length of the slice, wherein, $w_{slice,i}$ is a width of the individual slice, wherein k is a proportionality constant that captures a first-order dependence of current on slice length only, wherein W is the total device width and whereto $L_{nom}$ is the nominal length of the device.

7. The method of claim 1, wherein minimizing the geometric cost function to thereby form the minimized geometric cost function, further comprises:

determining, by the edge movement module, a fragment movement for a left side of each slice in the set of slices and a right side of each slice in the set of slices;

determining, by the edge movement module, a slice length related to edge placement errors of the left side of the slice and the right side of the slice;

analytically obtaining, by the edge movement module, a derivative of the geometric cost function in terms of mask shape movement for the left side of the slice and the right side of the slice; and determining, by the edge movement module, an amount of the mask shape movement Δd for the left side of the slice and the right side of the slice using the derivative of the geometric cost function in terms of mask shape movement for the left side of the slice and the right side of the slice.

8. The method of claim 7, wherein the slice length is determined using the following formula:

$$L_{slice,i} = L_{nom} + e_{left,i} + e_{right,i}$$

wherein $L_{slice,i}$ is a length of the slice, wherein $L_{nom}$ is the nominal length of the device, wherein $e_{left,i}$ is the EPE to the left side of the slice, and wherein $e_{right,i}$ is the EPE to the right site of the slice.

9. The method of claim 7, wherein the derivative of the geometric cost function in terms of mask shape movement for the left side of the slice and the right side of the slice are determined using the following formula for the left side of the slice:

$$\frac{\partial C_{OPC}}{\partial d_{left,i}} = -\frac{1}{L_{slice,i}^2} \frac{\partial e_{left,i}}{\partial d_{left,i}}$$

and for the right side of the slice:

$$\frac{\partial C_{OPC}}{\partial d_{right,i}} = -\frac{1}{L_{slice,i}^2} \frac{\partial e_{right,i}}{\partial d_{right,i}}$$

wherein $L_{slice,i}$ is a length Of the slice, wherein $e_{left,i}$ is the EPE to the left side of the slice, wherein $e_{right,i}$ is the EPE to the right side of the slice, wherein $d_{right,i}$ is the location of the mask fragment for the right side of the slice, and wherein $d_{left,i}$ is the location of the mask fragment for the left side of the slice.

10. The method of claim 7, wherein the amount of the mask shape movement Δd for the left side of the slice is determined using the following formula:

$$\Delta d_{left,i} = -\eta \frac{\partial C_{OPC}}{\partial d_{left,i}}$$

and wherein the amount of the mask shape movement Δd for the right side of the slice is determined using the following formula:

$$\Delta d_{right,i} = -\eta \frac{\partial C_{OPC}}{\partial d_{right,i}}$$

wherein $\Delta d_{left,i}$ is a fragment movement for a left side of the slice, wherein $\Delta d_{right,i}$ is a fragment movement for a right side of the slice, wherein $d_{right,i}$ is the location of the mask fragment for the right side of the slice, wherein $d_{left,i}$ is the location of the mask fragment for the left side of the slice, and wherein $\eta$ is a pre-specified fraction of the derivative.

11. A computer program product comprising a non-transitory computer readable storage medium having a computer readable program stored therein, wherein the computer readable program, when executed on a computing device, causes the computing device to:

generate an image of a mask shape based on a target shape on a wafer thereby forming one or more lithographic contours;

determine a geometric cost function associated with the one or more lithographic contours;

minimize the geometric cost function thereby forming a minimized geometric cost function;

determine a set of edge movements for each slice in a set of slices associated with the one or more lithographic contours using the minimized geometric cost function;

move the edges of the mask shape using the set of edge movements for each slice in the set of slices; and produce a clean mask shape using the set of edge movements.

12. The computer program product of claim 11, wherein the computer readable program to determine the geometric cost function associated with the one or more lithographic contours further causes the computing device to:

slice the one or more lithographic contours into the set of slices;

determine a sum of widths of the set of slices thereby forming a width of the device;

identify a slice current for each slice thereby forming a set of individual slice currents;

sum a total current through the one or more lithographic contours using the set of individual slice currents;

determine an error between the total current through the one or more lithographic contours and a total current of the target shape; and determine a difference in current between the one or more lithographic contours and the target shape to thereby form the geometric cost function.

13. The computer program product of claim 12, wherein each slice current is determined using the following formula:

$$I_{slice,i} = k \frac{w_{slice,i}}{L_{slice,i}}$$

wherein $I_{slice,i}$ is the individual slice current, wherein $L_{slice,i}$ is a length of the slice, wherein $w_{slice,i}$ is a width of the individual slice, and wherein k is a proportionality constant that captures a first-order dependence of current, on slice length only;

wherein the total current through the one or more lithographic contours using the individual slice currents is determined using the following formula:

$$I_{contour} = \sum_i I_{slice,i}$$

wherein $I_{contour}$ is the total current and wherein $I_{slice,i}$ is the individual slice current;

wherein the error between the total current through the one or more lithographic contours and the total current of the target shape is determined using the following formula:

$$I_{contour} - I_{target} = \sum_i k \frac{w_{slice,i}}{L_{slice,i}} - k \frac{W}{L_{nom}}$$

wherein $I_{contour}$ is the total current through the one or more lithographic contours, wherein $I_{target}$ is the total current of the target, wherein $L_{slice,i}$ is a length of the slice, wherein $w_{slice,i}$ is a width of the individual slice, wherein k is a proportionality constant that captures a first-order dependence of current on slice length only, wherein W is the total device width, and wherein $L_{nom}$ is the nominal length of the device; and wherein the geometric cost function is described for the device in the following formula:

$$C_{OPC} = I_{contour} - I_{target} = k \left[ \sum_i \frac{W}{L_{slice,i}} - \sum_i \frac{W}{L_{nom}} \right]$$

which may be rewritten as:

$$C_{OPC} = \sum_i \left[ \frac{1}{L_{slice,i}} - \frac{1}{L_{nom}} \right]$$

wherein $I_{contour}$ is the total current through the one or more lithographic contours, wherein $I_{target}$ is the total current of the target, wherein $L_{slice,i}$ is a length of the slice, wherein $w_{slice,i}$ is a width of the individual slice, wherein k is a proportionality constant that captures a first-order dependence of current on slice length only, wherein W is the total device width, and wherein $L_{nom}$ is the nominal length of the device.

14. The computer program product of claim 11, wherein the computer readable program to minimize the geometric cost function to thereby form the minimized geometric cost function, further causes the computing device to:

determine a fragment movement for a left side of each slice in the set of slices and a right side of each slice in the set of slices;

determine a slice length related to edge placement errors of the left side of slice and the right side of the slice;

analytically obtain a derivative of the geometric cost function in terms of mask shape movement for the left side of the slice and the right side of the slice: and determine an amount of the mask shape movement $\Delta d$ for the left side of the slice and the right side of the slice using the derivative of the geometric cost function in terms of mask shape movement for the left side of the slice and the right side of the slice.

15. The computer program product of claim 14, wherein the slice length is determined using the following formula:

$$L_{slice,i} = L_{nom} + e_{left,i} + e_{right,i}$$

wherein $L_{slice,i}$ is a length of the slice, wherein $L_{nom}$ is the nominal length of the device, wherein $e_{left,i}$ is the EPE to the left side of the slice, and wherein $e_{right,i}$ is the EPE to the right side of the slice;

wherein the derivative of the geometric cost function in terms of mask shape movement for the left side of the slice and the right side of the slice are determined using the following formula for the left side of the slice:

$$\frac{\partial C_{OPC}}{\partial d_{left,i}} = -\frac{1}{L_{slice,i}^2} \frac{\partial e_{left,i}}{\partial d_{left,i}}$$

and for the right side of the slice:

$$\frac{\partial C_{OPC}}{\partial d_{right,i}} = -\frac{1}{L_{slice,i}^2} \frac{\partial e_{right,i}}{\partial d_{right,i}}$$

wherein $L_{slice,i}$ is a length of the slice, wherein $e_{left,i}$ is the EPE to the left side of the slice, wherein $e_{right,i}$ is the EPE to the right side of the slice, wherein $d_{right,i}$ is the location of the mask fragment for the right side of the slice, and wherein $d_{left,i}$ is the location of the mask fragment for the left side of the slice; and wherein the amount of the mask shape movement Δd for the left side of the slice is determined using the following formula;

$$\Delta d_{left,i} = -\eta \frac{\partial C_{OPC}}{\partial d_{left,i}}$$

and wherein the amount of the mask shape movement Δd for the right side of the slice is determined using the following formula:

$$\Delta d_{right,i} = -\eta \frac{\partial C_{OPC}}{\partial d_{right,i}}$$

wherein $\Delta d_{left,i}$ is a fragment movement for a left side of the slice, wherein $\Delta d_{right,i}$ is a fragment movement for a right side of the slice, wherein $d_{right,i}$ is the location of the mask fragment for the right side of the slice, wherein $d_{left,i}$ is the location of the mask fragment for the left side of the slice, and wherein η is a pre-specified fraction of the derivative.

16. An apparatus, comprising:
a processor; and
a memory coupled to the processor, wherein the memory comprises instructions which, when executed by the processor, cause the processor to:
generate an image of a mask shape based on a target shape on a wafer thereby forming one or more lithographic contours;
determine a geometric cost function associated with the one or more lithographic contours;
minimize the geometric cost function thereby forming a minimized geometric cost function;
determine a set of edge movements for each slice in a set of slices associated with the one or more lithographic contours using the minimized geometric cost function;
move the edges of the mask shape using the set of edge movements for each slice in the set of slices; and
produce a clean mask shape using the set of edge movements.

17. The apparatus of claim 16, wherein the instructions to determine the geometric cost function associated with the one or more lithographic contours further cause the processor to:
slice the one or more lithographic contours into the set of slices;
determine a sum of widths of the set of slices thereby forming a width of the device;
identify a slice current for each slice thereby forming a set of individual slice currents;
sum a total current through the one or more lithographic contours using the set of individual slice currents;
determine an error between the total current through the one or more lithographic contours and a total current of the target shape; and
determine a difference in current between the one or more lithographic contours and the target shape to thereby form the geometric cost function.

18. The apparatus of claim 17, wherein each slice current is determined using the following formula:

$$I_{slice,i} = k \frac{w_{slice,i}}{L_{slice,i}}$$

wherein $I_{slice,i}$ is the individual slice current wherein $L_{slice,i}$ a length of the slice, wherein $w_{slice,i}$ is a width of the individual slice, and wherein k is a proportionality constant that captures a first-order dependence of current on slice length only;

wherein the total current through the one or more lithographic contours using the individual slice currents is determined using the following formula:

$$I_{contour} = \sum_i I_{slice,i}$$

wherein $I_{contour}$ is the total current and wherein $I_{slice,i}$ is the individual slice current;

wherein the error between the total current through the one or more lithographic co hours and the total current of the target shape is determined using the following formula:

$$I_{contour} - I_{target} = \sum_i k \frac{w_{slice,i}}{L_{slice,i}} - k \frac{W}{L_{nom}}$$

wherein $I_{contour}$ is the total current through the one or more lithographic contours, wherein $I_{target}$ is the total current of the target, wherein $L_{slice,i}$ is a length of the slice, wherein $w_{slice,i}$ is a width of the individual slice, wherein k is a proportionality constant that captures a first-order dependence of current on slice length only, wherein W is the total device width, and wherein $L_{nom}$ is the nominal length of the device; and wherein the geometric cost function is described for the device in the following formula:

$$C_{OPC} = I_{contour} - I_{target} = k\left[\sum_i \frac{W}{L_{slice,i}} - \sum_i \frac{W}{L_{nom}}\right]$$

which may be rewritten as:

$$C_{OPC} = \sum_i \left[\frac{1}{L_{slice,i}} - \frac{1}{L_{nom}}\right]$$

wherein $I_{contour}$ is the total current through the one or more lithographic contours, wherein $I_{target}$ is the total current of the target, wherein $L_{slice,i}$ is a length of the slice, wherein $w_{slice,i}$ is a width of the individual slice, wherein k is a proportionality constant that captures a first-order dependence of current on slice length only, wherein W is the total device width, and wherein $L_{nom}$ is the nominal length of the device.

19. The apparatus of claim 16, wherein the instructions to minimize the geometric cost function to thereby form the minimized geometric cost function, further cause the processor to:
determine a fragment movement for a left side of each slice in the set of slices and a right side of each slice in the set of slices;
determine a slice length related to edge placement errors of the left side of the slice and the right side of the slice;
analytically obtain a derivative of the geometric cost function in terms of mask shape movement for the left side of the slice and the right side of the slice; and
determine an amount of the mask shape movement $\Delta d$ for the left side of the slice and the right side of the slice using the derivative of the geometric cost function in terms of mask shape movement for the left side of the slice and the right side of the slice.

20. The apparatus of claim 19, wherein the slice length is determined using the following formula:

$$L_{slice,i} = L_{nom} + e_{left,i} + e_{right,i}$$

wherein $L_{slice,i}$ is a length of the slice, wherein $L_{nom}$ is the nominal length of the device, wherein $e_{left,i}$ is the EPE to the left side of the slice, and wherein $e_{right,i}$ is the EPE to the right side of the slice;

wherein the derivative of the geometric cost function in terms of mask shape movement for the left side of the slice and the right side of the slice are determined using the following formula for the left side of the slice:

$$\frac{\partial C_{OPC}}{\partial d_{left,i}} = -\frac{1}{L_{slice,i}^2} \frac{\partial e_{left,i}}{\partial d_{left,i}}$$

and for the right side of the slice:

$$\frac{\partial C_{OPC}}{\partial d_{right,i}} = -\frac{1}{L_{slice,i}^2} \frac{\partial e_{right,i}}{\partial d_{right,i}}$$

wherein $L_{slice,i}$ is a length of the slice, wherein $e_{left,i}$ is the EPE to the left side of the slice, wherein $e_{right,i}$ is the EPE to the right side of the slice, wherein $d_{right,i}$ is the location of the mask fragment for the right side of the slice, and wherein $d_{left,i}$ is the location of the mask fragment for the left side of the slice; and
wherein the amount of the mask shape movement $\Delta d$ for the left side of the slice is determined using the following formula:

$$\Delta d_{left,i} = -\eta \frac{\partial C_{OPC}}{\partial d_{left,i}}$$

and wherein the amount of the mask shape movement $\Delta d$ for the right side the slice is determined using the following formula:

$$\Delta d_{right,i} = -\eta \frac{\partial C_{OPC}}{\partial d_{right,i}}$$

wherein $\Delta d_{left,i}$ is a fragment movement for a left side of the slice, wherein $\Delta d_{right,i}$ is a fragment movement for d right side of the slice, wherein $d_{right,i}$ is the location of the mask fragment for the right side of the slice, wherein $d_{left,i}$ is the location of the mask fragment for the left side of the slice, and wherein $\eta$ is a pre-specified fraction of the derivative.

* * * * *